(12) United States Patent
Chen

(10) Patent No.: US 7,514,977 B2
(45) Date of Patent: Apr. 7, 2009

(54) CLOCK SIGNAL GENERATING CIRCUIT

(75) Inventor: Chun-Hung Chen, Tu-Cheng (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 89 days.

(21) Appl. No.: 11/309,636

(22) Filed: Sep. 1, 2006

(65) Prior Publication Data

US 2007/0176692 A1    Aug. 2, 2007

(30) Foreign Application Priority Data

Jan. 21, 2006    (CN) .................... 2006 1 00333264

(51) Int. Cl.
*G06F 1/04* (2006.01)
*H03K 3/00* (2006.01)

(52) U.S. Cl. .............. 327/291; 327/115; 327/117; 327/118; 327/299

(58) Field of Classification Search .............. 327/291, 327/115, 117, 118, 299
See application file for complete search history.

(56) References Cited

U.S. PATENT DOCUMENTS

| 5,781,074 | A | 7/1998 | Nguyen et al. | |
|---|---|---|---|---|
| 6,426,660 | B1 * | 7/2002 | Ho et al. | 327/175 |
| 2004/0012416 | A1 * | 1/2004 | Cheung et al. | 327/115 |

* cited by examiner

*Primary Examiner*—Tuan T Lam
*Assistant Examiner*—Daniel Rojas
(74) *Attorney, Agent, or Firm*—Wei Te Chung

(57) ABSTRACT

A clock signal generating circuit is provided. The clock signal generating circuit includes a clock signal generator for generating a first clock signal having a predetermined frequency; a frequency dividing circuit receiving the first clock signal, for providing a second clock signal with a frequency that is lower than the predetermined frequency of the first clock signal; and a frequency multiplier circuit receiving the second clock signal, for providing a system clock signal resuming the predetermined frequency to a load.

9 Claims, 2 Drawing Sheets

CLOCK SIGNAL GENERATING CIRCUIT

FIELD OF THE INVENTION

The present invention relates to a clock signal generating circuit, and particularly to a clock signal generating circuit causing little electromagnetic interference.

DESCRIPTION OF RELATED ART

Use of digital clock-controlled signal-processing devices in various fields of application, particularly in computer systems, for the display or control of diverse functions requires clock signal generators. However, interference signals are also produced in a high-frequency clock signal generator, directly or via the connected supply or signal lines, in a wide frequency range. The interference signals may interfere with the operation of nearby devices.

Some methods are known in the art whereby a plurality of electromagnetic compatibility (EMC) filters are used with the clock signal generator to reduce electromagnetic interference to adjacent electronic equipment. However, the EMC filters can cause distortion of high-frequency clock signals.

What is needed, therefore, is a clock signal generating circuit that causes little electromagnetic interference to nearby electronic devices.

SUMMARY OF THE INVENTION

A clock signal generating circuit is provided. In a preferred embodiment, the clock signal generating circuit includes a clock signal generator for generating a first clock signal having a predetermined frequency; a frequency dividing circuit receiving the first clock signal, for providing a second clock signal with a frequency that is lower than the predetermined frequency of the first clock signal; and a frequency multiplier circuit receiving the second clock signal, for providing a system clock signal resuming the predetermined frequency to a load.

Other advantages and novel features will become more apparent from the following detailed description when taken in conjunction with the accompanying drawings, in which:

DETAILED DESCRIPTION OF THE INVENTION

Figure 1:
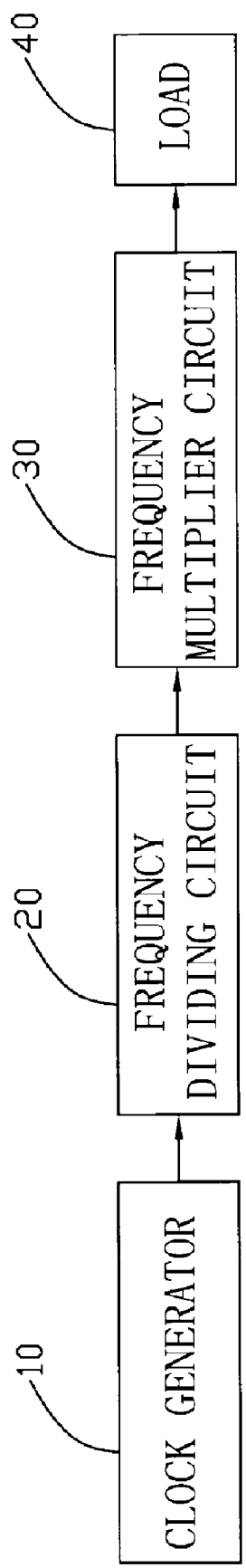
FIG. 1 is a block diagram of a clock signal generating circuit, in accordance with a preferred embodiment of the present invention.
Figure 2:
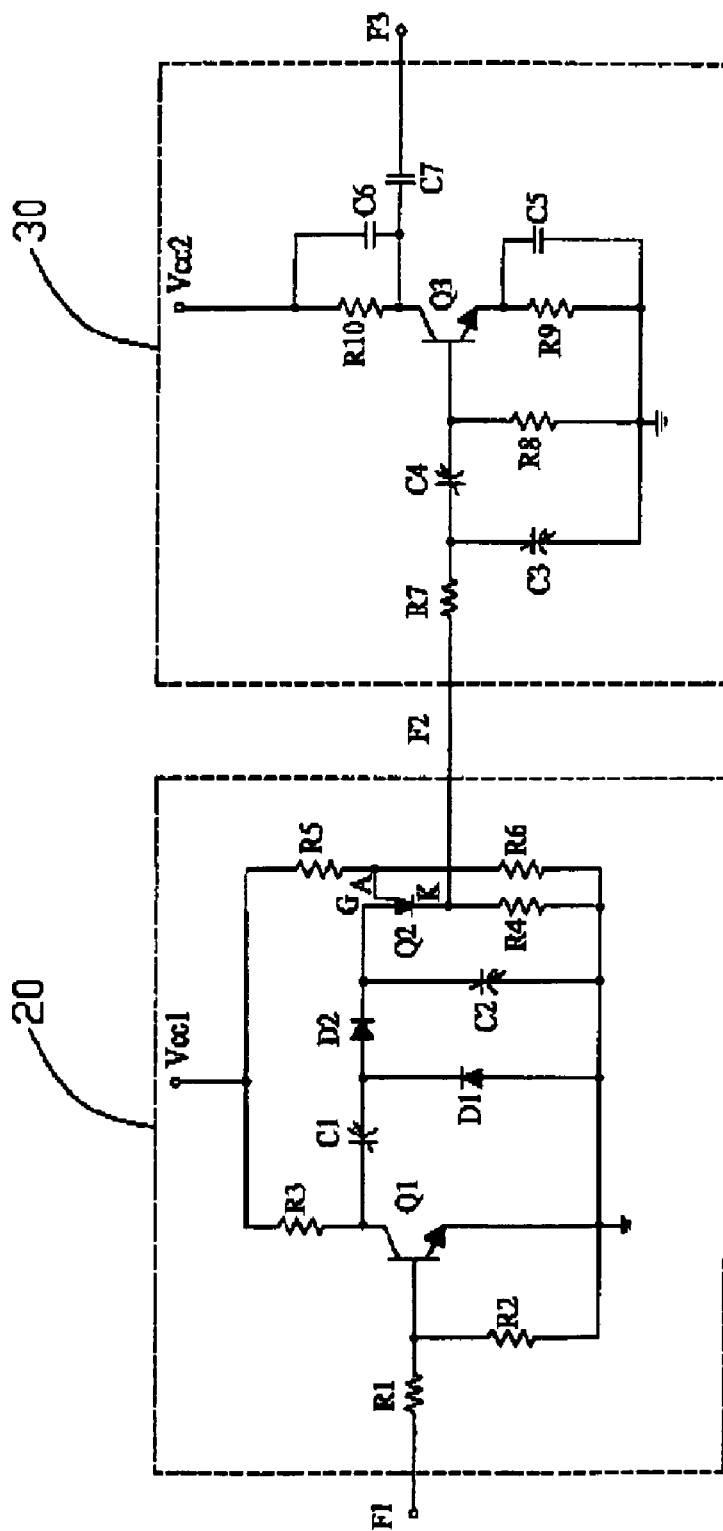
FIG. 2 is a circuit diagram of a frequency dividing circuit and a frequency multiplier circuit of FIG. 1.

FIGS. 1-2 show a clock signal generating circuit, in accordance with a preferred embodiment of the present invention. The clock signal generating circuit provides a system clock signal F3. The clock signal generating circuit includes a clock signal generator 10, a frequency dividing circuit 20, and a frequency multiplier circuit 30. The clock signal generator 10 generates a first clock signal F1 having a predetermined frequency f1. The frequency dividing circuit 20 receives the first clock signal F1, and provides a second clock signal F2 with a frequency f2 that is lower than the predetermined frequency f1 of the first clock signal F1. The frequency multiplier circuit 30 receives the second clock signal F2, and provides the system clock signal F3, resuming the predetermined frequency f1, to a load 40.

FIG. 2 shows the frequency dividing circuit 20 and the frequency multiplier circuit 30 of FIG. 1. The frequency dividing circuit 20 includes a voltage input Vcc1, an NPN transistor Q1, a programmable uni-junction transistor (PUT) Q2, variable capacitors C1, C2, diodes D1, D2, and resistors R1, R2, R3, R4, R5, R6. The transistor Q1 has an emitter connected to ground, a collector connected to the voltage input Vcc1 via the resistor R3, and a base connected to the clock signal generator 10 via the resistor R1 and also connected to ground via the resistor R2. The diode D1 has an anode connected to ground, and a cathode connected to the collector of the transistor Q1 via the capacitor C1. The diode D2 has a cathode connected to ground via the capacitor C2, and an anode connected to the collector of the transistor Q1 via the capacitor C1. The PUT Q2 has a gate G connected to the cathode of the diode D2, an anode A connected to the voltage input Vcc1 via the resistor R5 and also connected to ground via the resistor R6, and a cathode K connected to ground via the resistor R4 and providing the second clock signal F2.

The frequency multiplier circuit 30 includes a voltage input Vcc2, an NPN transistor Q3, variable capacitors C3, C4, capacitors C5, C6, C7, and resistors R7, R8, R9, R10. The resistors R7, R8 and the capacitors C3, C4 serve as a frequency selection network for selecting a harmonic component VM from the second clock signal F2. The resistors R9, R10, the capacitors C5, C6, and the transistor Q3 serve as a voltage amplifying circuit for amplifying a voltage of the harmonic component VM. The capacitor C7 filters a direct-current component of the amplified voltage of the harmonic component VM and provides the system clock signal F3.

In the frequency dividing circuit 20, a threshold voltage Uk of the PUT Q2 is found using the follow equation:

$$Uk = Vcc1 * C2/(C1+C2)$$

At a beginning of a cycle of the first clock signal F1, F1 is at a low level, the transistor Q1 is off, and the voltage input Vcc1 charges the capacitors C1, C2 until the voltage U1 across the capacitor C1 equals $Vcc1*C2/(C1+C2)$, and the voltage U2 across the capacitor C2 equals $Vcc1*C1/(C1+C2)$. When a rising edge of the first clock signal F1 occurs, the transistor Q1 turns on. Then the capacitor C1 discharges, and the capacitor C2 remains charged due to the diode D2. At a next cycle of F1 the voltage input Vcc1 charges the capacitors C1, C2 again until the voltage U1 equals $Vcc1*C2/(C1+C2)$, and the voltage U2 equals $2Vcc1*C1/(C1+C2)$. A time constant t is found using the follow equation:

$$t = C1/C2 \qquad (1)$$

From 0 to t*TF1 (TF1 is a period of the first clock signal F1) seconds of the charging portion of the cycles of F1 the voltage input Vcc1 charges the capacitors C1, C2 until the voltage U1 equals $Vcc1*C2/(C1+C2)$, and the voltage U2 equals $t*Vcc1*C1/(C1+C2)$, when the voltage U2 also equals the threshold voltage Uk of the PUT Q2. When the voltage U2 is larger than the threshold voltage Uk, the PUT Q2 turns on and outputs the second clock signal F2. Therefore a ratio of the predetermined frequency f1 of the first clock signal F1 to the frequency f2 of the second clock signal F2 equals t+1, and t+1 equals C1/C2+1.

In the frequency multiplier circuit 30, values of the resistors R7, R8 and the capacitors C3, C4 are found using a relationship corresponding to following inequality to acquire the harmonic component VM from the second clock signal F2:

$$(VM-1)*F2 < 1/(2\pi*R8*C4) \leq VM*F2 \leq 1/(2\pi*R7*C3) < (VM+1)*F2 \qquad (2)$$

A frequency f3 of the system clock signal F3 equals a frequency of the harmonic component VM. Therefore the frequency f3 is found using the follow equation:

$$f3 = VM*f2$$

For the system clock signal F3 to resume the predetermined frequency f1, the follow equation should be satisfied:

$$VM = t+1 \qquad (3)$$

After a desired f2 is ascertained, the parameters VM, C1, C2, C3, C4, R7, R8 can be acquired by the equations (1), (3) and inequality (2) mentioned above.

The frequency dividing circuit 20 converts the first clock signal F1 to the second clock signal F2 with the frequency f2 that is lower than the predetermined frequency f1 of the first clock signal F1. The second clock signal F2 with the lower frequency f2 transmitted on a printed circuit board (PCB) interfere less with the operation of nearby electronic devices. When the second clock signal F2 arrives at the load 40, the frequency multiplier circuit 30 converts the second clock signal F2 to the system clock signal F3 resuming the predetermined frequency f1 to the load 40.

It is believed that the present invention and its advantages will be understood from the foregoing description, and it will be apparent that various changes may be made thereto without departing from the spirit and scope of the invention or sacrificing all of its material advantages, the example hereinbefore described merely being a preferred or exemplary embodiment.

What is claimed is:

1. A clock signal generating circuit comprising:
   a clock signal generator for generating a first clock signal having a predetermined frequency;
   a frequency dividing circuit for receiving the first clock signal, for providing second clock signal with a frequency that is lower than the predetermined frequency of the first clock signal, wherein the frequency dividing circuit comprises:
      an NPN transistor having the emitter connected to ground, the collector connected to a voltage input, and the base connected to the clock signal generator;
      a programmable uni-junction transistor having the gate connected to the collector of the NPN transistor, the anode connected to a voltage input, and the cathode connected to ground;
      a first variable capacitor connected between the collector of the NPN transistor and the gate of the programmable uni-junction transistor; and
      a second variable capacitor connected between the gate of the programmable uni-junction transistor and ground; and
   a frequency multiplier circuit receiving the second clock signal, for providing a system clock signal resuming the predetermined frequency to a load.

2. The clock signal generating circuit as claimed in claim 1, wherein the frequency dividing circuit further comprises a first diode having an anode connected to ground, and a cathode connected to the collector of the NPN transistor via the first variable capacitor, and a second diode having a cathode connected to ground via the second variable capacitor, and an anode connected to the collector of the NPN transistor via the first variable capacitor.

3. The clock signal generating circuit as claimed in claim 2, wherein the frequency dividing circuit further comprises a first resistor connected between the clock signal generator and the base of the NPN transistor; a second resistor connected between the clock signal generator and ground; a third resistor connected between the collector of the NPN transistor and the voltage input; a fourth resistor connected between the cathode of the programmable uni-junction transistor and ground; a fifth resistor connected between the anode of the programmable uni-junction transistor and the voltage input; and a sixth resistor connected between the programmable uni-junction transistor and ground.

4. The clock signal generating circuit as claimed in claim 1, wherein the frequency multiplier circuit comprises:
   a frequency selection network for selecting a harmonic component of the second clock signal, wherein the frequency selection network comprises:
      a first resistor;
      a first capacitor connected to the first resistor in series, and connected between the cathode of the programmable uni-junction transistor and ground;
      a second resistor connected to the first capacitor in parallel; and
      a second capacitor connected between the first capacitor and the second resistor;
   a voltage amplifying circuit for amplifying a voltage of the harmonic component, wherein the voltage amplifying circuit comprises:
      an NPN transistor having the base connected to the cathode of the programmable uni-junction transistor via the first resistor and the second capacitor in series, the collector connected to a voltage input, the emitter connected to ground; and
   a filter circuit for filtering a direct-current component of the amplified voltage of the harmonic component and providing the system clock signal.

5. A clock signal generating circuit for providing a system clock signal, the clock signal generating circuit comprising:
   a clock signal generator for generating a first clock signal having a predetermined frequency;
   a frequency dividing circuit receiving the first clock signal, for providing a second clock signal with a frequency that is lower than the predetermined frequency of the first clock signal, the second clock signal being transmitted on a printed circuit board, wherein the frequency dividing circuit comprises:
      an NPN transistor having the emitter connected to ground, the collector connected to a voltage input, and the base connected to the clock signal generator;
      a programmable uni-junction transistor having the gate connected to the collector of the NPN transistor, the anode connected to a voltage input, and the cathode connected to ground;
      a first variable capacitor connected between the collector of the NPN transistor and the gate of the programmable uni-junction transistor; and
      a second variable capacitor connected between the gate of the programmable uni-junction transistor and ground; and
   a frequency multiplier circuit receiving the second clock signal, for providing the system clock signal resuming the predetermined frequency to a load connected with the printed circuit board.

6. The clock signal generating circuit as claimed in claim 5, wherein the frequency dividing circuit further comprises a first diode having an anode connected to ground, and a cathode connected to the collector of the NPN transistor via the first variable capacitor, and a second diode having a cathode connected to ground via the second variable capacitor, and an anode connected to the collector of the NPN transistor via the first variable capacitor.

7. The clock signal generating circuit as claimed in claim 6, wherein the frequency dividing circuit further comprises a first resistor connected between the clock signal generator and the base of the NPN transistor; a second resistor connected between the clock signal generator and ground; a third resistor connected between the collector of the NPN transistor and the voltage input; a fourth resistor connected between the cathode of the programmable uni-junction transistor and ground; a fifth resistor connected between the anode of the programmable uni-junction transistor and the voltage input; and a sixth resistor connected between the programmable uni-junction transistor and ground.

8. The clock signal generating circuit as claimed in claim 5, wherein the frequency multiplier circuit comprises:
- a frequency selection network for selecting a harmonic component of the second clock signal, wherein the frequency selection network comprises:
  - a first resistor;
  - a first capacitor connected to the first resistor in series, and connected between the cathode of the programmable uni-junction transistor and ground;
  - a second resistor connected to the first capacitor in parallel; and
  - a second capacitor connected between the first capacitor and the second resistor;
- a voltage amplifying circuit for amplifying a voltage of the harmonic component, wherein the voltage amplifying circuit comprises:
- an NPN transistor having the base connected to the cathode of the programmable uni-junction transistor via the first resistor and the second capacitor in series, the collector connected to a voltage input, the emitter connected to ground; and
- a filter circuit for filtering a direct-current component of the amplified voltage of the harmonic component and providing the system clock signal.

9. a clock signal generating circuit comprising:
- a clock signal generator for generating a first clock signal having a predetermined frequency;
- a frequency dividing circuit receiving the first clock signal, for providing a second clock signal with a frequency that is lower than the predetermined frequency of the first clock signal; and
- a frequency multiplier circuit receiving the second clock signal, for providing a system clock signal resuming the predetermined frequency to a load,
wherein the frequency dividing circuit comprises an NPN transistor having an emitter connected to ground, a collector connected to a voltage input, and a base connected to the clock signal generator; and
wherein the frequency dividing circuit further comprises a first diode having an anode connected to ground, and a cathode connected to the collector of the NPN transistor via a first variable capacitor, and a second diode having a cathode connected to ground via a second variable capacitor, and an anode connected to the collector of the NPN transistor via the first variable capacitor.

* * * * *